(12) United States Patent
Potts et al.

(10) Patent No.: US 9,256,707 B2
(45) Date of Patent: *Feb. 9, 2016

(54) TRACE ROUTING ACCORDING TO FREEFORM SKETCHES

(71) Applicant: Mentor Graphics Corporation, Wilsonville, OR (US)

(72) Inventors: Henry Potts, Ft. Collins, CO (US); Mikhail Zuzin, Moscow (RU); Charles Pfeil, Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/589,769

(22) Filed: Jan. 5, 2015

(65) Prior Publication Data

US 2015/0193572 A1   Jul. 9, 2015

Related U.S. Application Data

(63) Continuation of application No. 12/499,600, filed on Jul. 8, 2009, now Pat. No. 8,930,868.

(51) Int. Cl.
*G06F 17/50* (2006.01)

(52) U.S. Cl.
CPC .................................. *G06F 17/5077* (2013.01)

(58) Field of Classification Search
CPC .................................................. G06F 17/5077
USPC .................. 716/100–102, 110, 119, 122, 126
See application file for complete search history.

(56) References Cited

U.S. PATENT DOCUMENTS

| | | | | |
|---|---|---|---|---|
| 7,536,665 | B1 * | 5/2009 | Horlick et al. | 716/126 |
| 8,250,514 | B1 * | 8/2012 | Wadland et al. | 716/131 |

* cited by examiner

*Primary Examiner* — Paul Dinh
(74) *Attorney, Agent, or Firm* — Mentor Graphics Corporation

(57) ABSTRACT

Methods and apparatuses for routing traces in a layout design, such as for example a layout design for an integrated circuit, are disclosed. In various implementations, a group of netlines within a layout design and a freeform sketch are identified. Subsequently, the netlines are routed as traces according to the freeform sketch. More particularly, the geometry of the traces is determined by approximating the geometry of the freeform sketch. Various implementations of the invention provide for the netlines to be routed by an automated trace routing engine. With further implementations of the invention, ball grid array escapes and trace fanouts are additionally routed. For example, ball grid array escapes may be routed prior to netlines being routed according to the freeform sketch. In further implementations of the invention, the freeform sketch is deleted after the traces have been routed. With various implementations of the invention, the netlines are routed as traces by forming a container shape around the freeform sketch, approximating the geometry of the freeform sketch within the container shape, and routing traces within the container shape using the approximation of the freeform shape as a guide.

20 Claims, 16 Drawing Sheets

TRACE ROUTING ACCORDING TO FREEFORM SKETCHES

RELATED APPLICATIONS

This patent application is a continuation of and claims priority to U.S. patent application Ser. No. 12/499,600, filed Jul. 8, 2009, which is incorporated herein by reference.

FIELD OF THE INVENTION

The invention relates to the field of routing connections between components within an electronic device. More specifically, various implementations apply to routing connections in a design for a printed circuit board, or a design for an integrated circuit, or a design for a system on chip.

BACKGROUND OF THE INVENTION

Integrated circuit devices are used in a wide variety of modern appliances, such as computers, automobiles, telephones, televisions, manufacturing tools, satellites and even toys. While even a small integrated circuit device can provide a great deal of functionality, almost every integrated circuit device must be electrically connected to an input or output device, to another integrated circuit device, or to some other electronic component in order to be useful. To provide these electrical connections, integrated circuit devices are typically mounted on a printed circuit board (PCB). Most printed circuit boards have a rigid, planar core. The core may be formed, for example, of a sheet of fiberglass material impregnated with epoxy. Conductive lines or "traces" then are formed on one or both surfaces of the core, to electronically connect the components attached to the printed circuit board. The traces may be formed of any desired conductive material, such as copper. With various manufacturing techniques, specific traces may be created by etching a single layer of conductive material in a photolithographic process.

Simple printed circuit boards may have only a single core, with traces on one or both sides of the core. More complex printed circuit boards, however, may have multiple cores, with traces on one or both sides of one or more of the cores. These multilayered printed circuit boards also may include layers of insulating material, to prevent traces on adjacent core surfaces from contacting. In addition, a multilayered printed circuit board will typically include one or more "vias" to electrically connect two or more different layers of the board. A via is created by drilling or otherwise forming a hole through one or more cores. The walls of the via may then be clad with conductive material to form an electrical connection between the different layers. Alternately or additionally, the entire via may be filled with conductive material to form the electrical connection. Some vias may pass through every layer of the board, while other vias may connect only some of the layers in the board. Some vias, referred to as "blind" vias, will connect only internal layers of the board, and are not connected to either the uppermost or lowermost layers. As will be explained in more detail below, vias are employed where, for example, a component requires more traces than can be routed in a corresponding area of a single board layer. The vias allow the component to connect to traces on other layers of the board.

There are a number of steps performed in the design of a printed circuit board. Initially, a designer will create a schematic diagram for the system to be connected through the printed circuit board. This process includes identifying each component that will be included in the system. A system can include "active" components, such as field programmable gate array (FPGA) integrated circuits or application-specific integrated circuits (ASICs). A system also can include "passive" components, such as, resistors, capacitors, and inductors. In addition to identifying each component, the schematic design will represent the electrical connections that must be formed between each component. Next, a designer typically will verify the functionality of the system described in the schematic design. The design may, for example, use software modeling tools to ensure that the system described in the schematic will reliably perform the desired operations. If any errors are detected, then the schematic design may be corrected to address the errors, and the functional verification process repeated.

Once the schematic design is finalized, the designer will typically create a physical design to implement the schematic design. This physical design is sometimes referred to as the design layout or layout design. Herein, design layout and layout design are used interchangeably. The designer will begin by selecting a physical location in the layout design for each component. When a location for a component has been selected, the designer may add a component object, representing that component, to that location in the design layout. The component object may include a variety of information regarding the physical component it represents, such as the configuration of the connection pins used to electrically connect that component to other components. With an integrated circuit device, for example, the substrate with the integrated circuit will be encased in a package for protection from the environment. The connection pins serve to provide an electrical connection, through the packaging, to the electrical contacts of the integrated circuit. After the component objects for the various components are located in the design layout, the designer then will attempt to route traces in the design layout to connect the components as specified in the schematic design.

In order to route traces efficiently, a designer may display netlines before routing the traces. A netline is a graphical line rendered in a physical design for a printed circuit board that spans selected pins in a "net." FIG. 1 illustrates a design layout 101 containing netlines 103 extending between pins 105 of two separate components 107 and 109. Routing traces is complicated by the fact that many systems have a variety of constraints restricting how a designer can route the traces. For example, a component's minimum current requirement may require that the trace supplying that current have a minimum width. Also, traces may require a minimum separation distance to prevent unacceptable crosstalk. Still further, if a component requires a differential pair connection, then the traces used to implement that differential pair may need to have the same length and maintain a constant distance from each other. Timing constraints may limit the length and/or impedance of a trace. Additionally, traces may not cross, as a connection between the crossing traces would be created.

To facilitate routing traces that do not cross over each other, designers will typically assign a bias to each layer of the printed circuit board. The layer bias will specify which direction, for example horizontal or vertical, the traces within that layer should be routed. FIG. 2 illustrates the layout design 101 of FIG. 1, including the components 107 and 109. As can be seen in FIG. 2, traces 203 have been added to the layout design 101. The traces 203 connect the pins 105, as indicated by the netlines 103 from FIG. 1. As further illustrated, some of the traces 203 are routed horizontally while others of the traces 203 are routed vertically on a separate layer. More particularly, FIG. 2 shows a horizontal trace 205 and a vertical trace 207. As can be seen, the horizontal trace 205 is routed on a different layer of the layout design than the vertical trace 207 is routed.

After creating an initial physical design and routing traces within the layout design, a designer may revise either the physical design or the layout design several times before it is finished. These revisions may include, for example, moving the pathways for traces, altering the width of traces at various points along their lengths, creating partial traces or "hangers," moving the location of one or more of the components, and rotating the orientation of one or more of the components. Each revision, however, may itself require related revisions. For example, if a component is moved or rotated, then every existing trace associated with that component must be discarded and replaced.

Most modern designs contain many components, and as a result, many more netlines 103 and traces 203 than illustrates by FIG. 1 and FIG. 2. For example, a modern design may contain thousands of components and thousands of netlines, which adds to the complexity and tedium of routing traces. In order to assist in routing these modern designs, automated trace routing tools, such as for example the Expedition toolset available from Mentor Graphics Corporation of Wilsonville, Oreg., have been developed. However, although automated trace routing tools exist, manually routing design layouts is still preferably in many instances. More particularly, the traces routed by hand may often be placed in a more preferably position that the traces routed by an automated trace routing tools.

SUMMARY OF THE INVENTION

Various implementations of the invention provide methods and apparatuses for routing traces in a layout design. In various implementations of the invention, a group of netlines within a layout design for a printed circuit board and a freeform sketch are identified. Subsequently, the netlines are routed as traces according to the freeform sketch. More particularly, the geometry of the traces is determined by approximating the geometry of the freeform sketch. Various implementations of the invention provide for the netlines to be routed by an automated trace routing engine. With further implementations of the invention, ball grid array escapes and trace fanouts are additionally routed. For example, ball grid array escapes may be routed prior to netlines being routed according to the freeform sketch. In further implementations of the invention, the freeform sketch is deleted after the traces have been routed.

With various implementations of the invention, the netlines are routed as traces by forming a container shape around the freeform sketch, approximating the geometry of the freeform sketch within the container shape, and routing traces within the container shape using the approximation of the freeform shape as a guide.

These and additional aspects, features and implementations of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which:

FIG. 12 illustrates a method of routing netlines as traces;

DETAILED DESCRIPTION OF ILLUSTRATIVE EMBODIMENTS

Introduction

Figure 1:
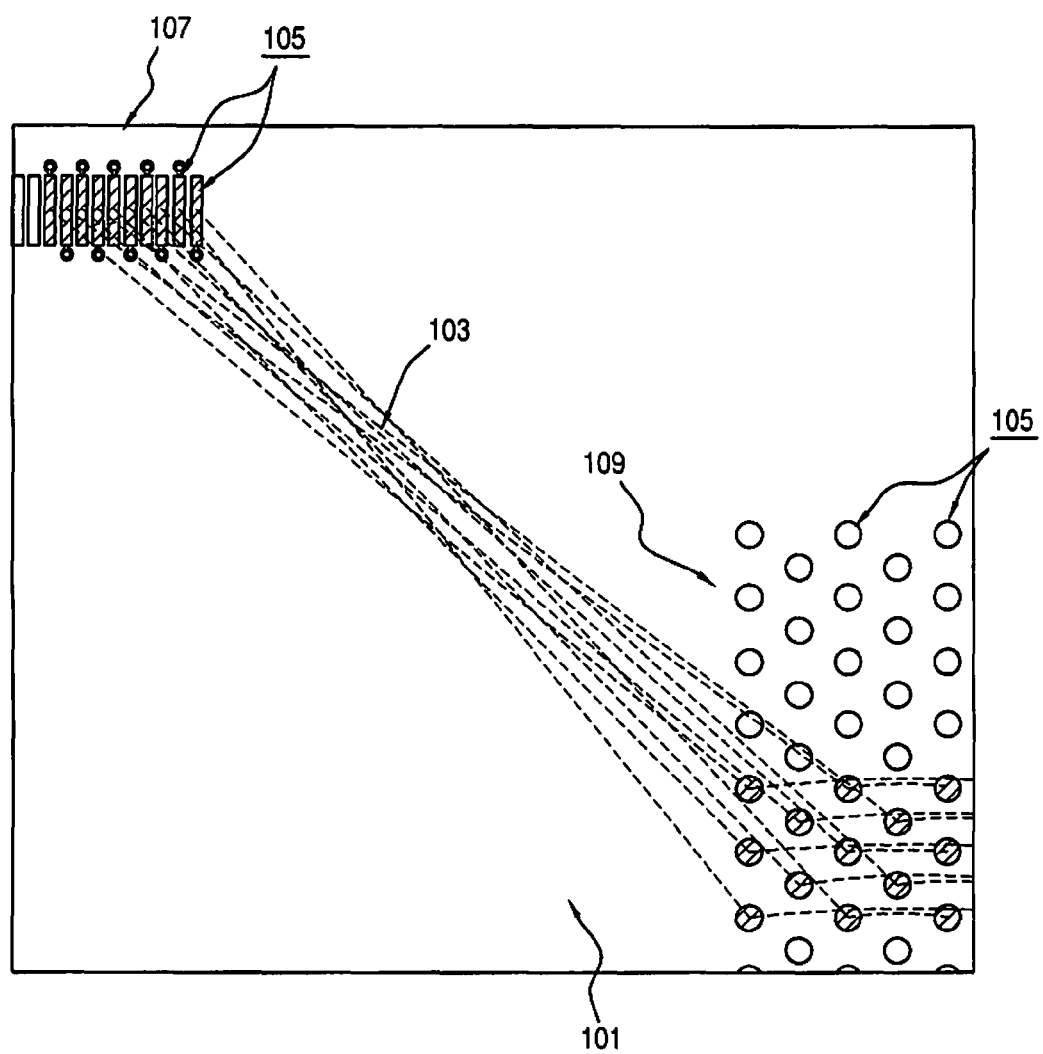
FIG. 1 illustrates a printed circuit board layout design including netlines.
Figure 2:
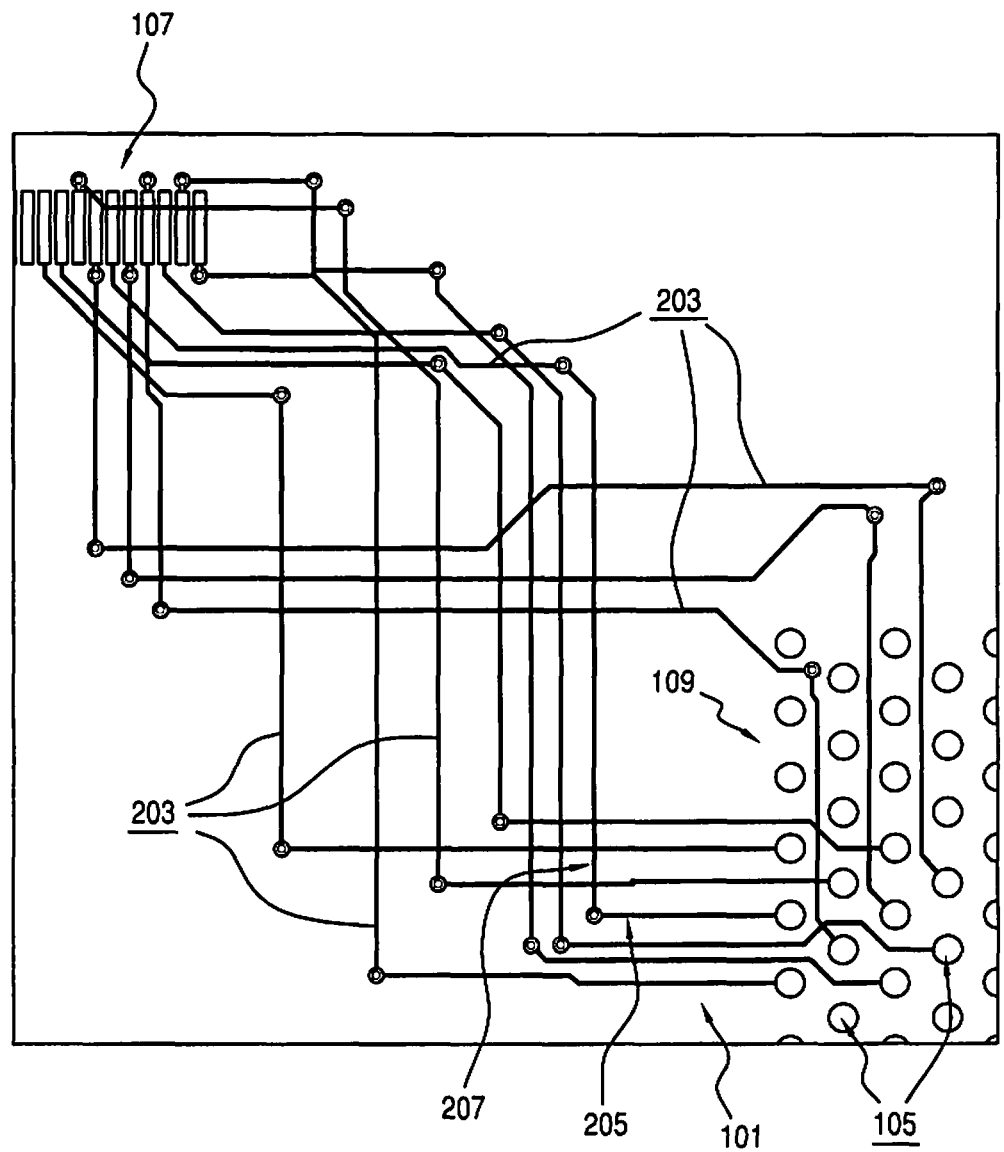
FIG. 2 illustrates the printed circuit board layout design of FIG. 1, with the netlines routed as traces.

As detailed above, a freeform sketch may be employed by an automated trace routing tools to assist in determining trace placement locations within an electronic device design layout. Although the operations of some of the disclosed methods, apparatus, and systems are described in a particular, sequential order for convenient presentation, it should be understood that this manner of description encompasses rearrangement, unless a particular ordering is required by specific language set forth in the claims below. For example, operations described sequentially may in some cases be rearranged or performed concurrently. Moreover, for the sake of simplicity, the figures may not show the various ways in which the disclosed methods, apparatus, and systems can be used in conjunction with other methods, apparatus, and systems. Additionally, the description sometimes uses terms like "generate", "determine" and "access" to describe the disclosed methods. These terms are high-level abstractions of the actual operations that are performed. The actual operations that correspond to these terms may vary depending on the particular implementation and are readily discernible by one of ordinary skill in the art.

Various implementations of the invention apply to routing traces in a design layout according to a freeform sketch. For example, the design layout of printed circuit boards or application-specific integrated circuits (ASICs), including mixed-signal application-specific integrated circuits, systems-on-a-chip (SoCs), and programmable logic devices (PLDs), such as field programmable gate arrays (FPGAs). Furthermore, various embodiments of the invention may be implemented to manipulate, modify, or otherwise change data, representing a design layout. However, as those of skill in the art will appreciate, the manipulated, modified, or otherwise changed data represents the layout design for a physical device. Accordingly, the layout design may be employed in a manufacturing process to create the physical device according to the manipulated, modified, or otherwise changed layout design.

With various implementations, the intermediate results or the final output produced by any of the disclosed methods, apparatus, and systems can be stored on one or more computer readable medium as part of the described methods and techniques. Additionally, a computer readable medium bearing the intermediate results or the final output may be accessed and used by a single programmable computing device or a plurality of programmable computing devices, such as for example a computing workstation connected on a network to a computing server.

Various implementations of the invention may use circuit design information. For example, printed circuit board layout information, such as a .HYP file, device models such as IBIS models, netlists, GDSII descriptions, or HDL descriptions such as Verilog or VHDL description, or other similar layout or device design description stored on one or more computer readable medium. In certain implementations, the circuits to be simulated are instantiated as SPICE or Eldo models for simulation. For presentation purposes, the present disclosure sometimes refers to circuit components by their physical counterparts, such as drivers, channels, signals, and other such terms. It should be understood, however, that any such reference not only includes the physical components but also representations of such circuit components and signals on the components as may be used in a computer implemented electronic design automation (EDA) tool.

Any of the methods or techniques described herein can be performed using software that comprises computer executable instructions for causing a computer to perform the methods or techniques stored on one or more computer readable medium. Such software can comprise, for example, an electronic design automation tool. With various implementations of the invention, the software may be executed on a single computer. With other implementations, the software may be executed upon a networked computer system. For example, via the Internet, a wide area network, a local area network, a client server network, or other such network. For clarity, only certain selected aspects of the software based implementations are described. Other details that are well known in the art are omitted. For example, it should be understood that the disclosed technology is not limited to any specific computer language or program. An illustrative computing environment is described, but it is to be understood that this environment is not limiting and although all possible computing environments are not described, those of skill in the art are still capable of practicing the invention based upon the following disclosure.

Illustrative Computing Environment

Various embodiments of the invention are implemented using computer executable software instructions executed by one or more programmable computing devices. Because these examples of the invention may be implemented using software instructions, the components and operation of a generic programmable computer system on which various embodiments of the invention may be employed is described. Further, because of the complexity of some electronic design automation processes and the large size of many circuit designs, various electronic design automation tools are configured to operate on a computing system capable of simultaneously running multiple processing threads. The components and operation of a computer network 301 having a host or master computer and one or more remote or slave computers therefore will be described with reference to FIG. 3. This operating environment is only one example of a suitable operating environment, however, and is not intended to suggest any limitation as to the scope of use or functionality of the invention.

Figure 3:
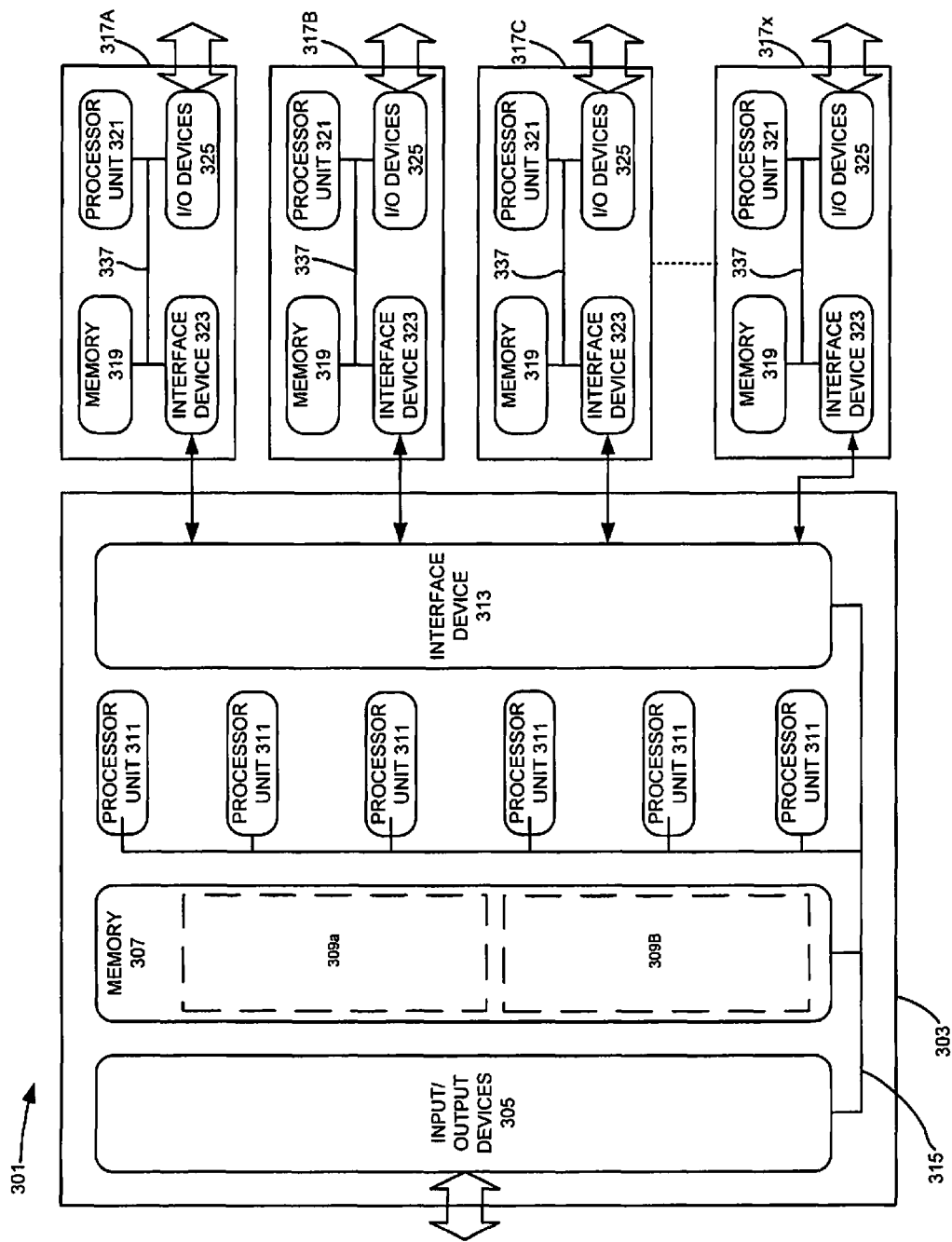
FIG. 3 illustrates a computer system, useable for implementing various embodiments of the present invention.

In FIG. 3, the computer network 301 includes a master computer 303. In the illustrated example, the master computer 303 is a multi-processor computer that includes a plurality of input and output devices 305 and a memory 307. The input and output devices 305 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 307 may similarly be implemented using any combination of computer readable media that can be accessed by the master computer 303. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 303 runs a software application for performing one or more operations according to various examples of the invention. Accordingly, the memory 307 stores software instructions 309A that, when executed, will implement a software application for performing one or more operations. The memory 307 also stores data 309B to be used with the software application. In the illustrated embodiment, the data 309B contains process data that the software application uses to perform the operations, at least some of which may be parallel.

The master computer 303 also includes a plurality of processor units 311 and an interface device 313. The processor units 311 may be any type of processor device that can be programmed to execute the software instructions 309A, but will conventionally be a microprocessor device. For example, one or more of the processor units 311 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 311 may be a custom manufactured processor, such as a microprocessor designed to optimally perform specific types of mathematical operations. The interface device 313, the processor units 311, the memory 307 and the input/output devices 305 are connected together by a bus 315.

Figure 4:
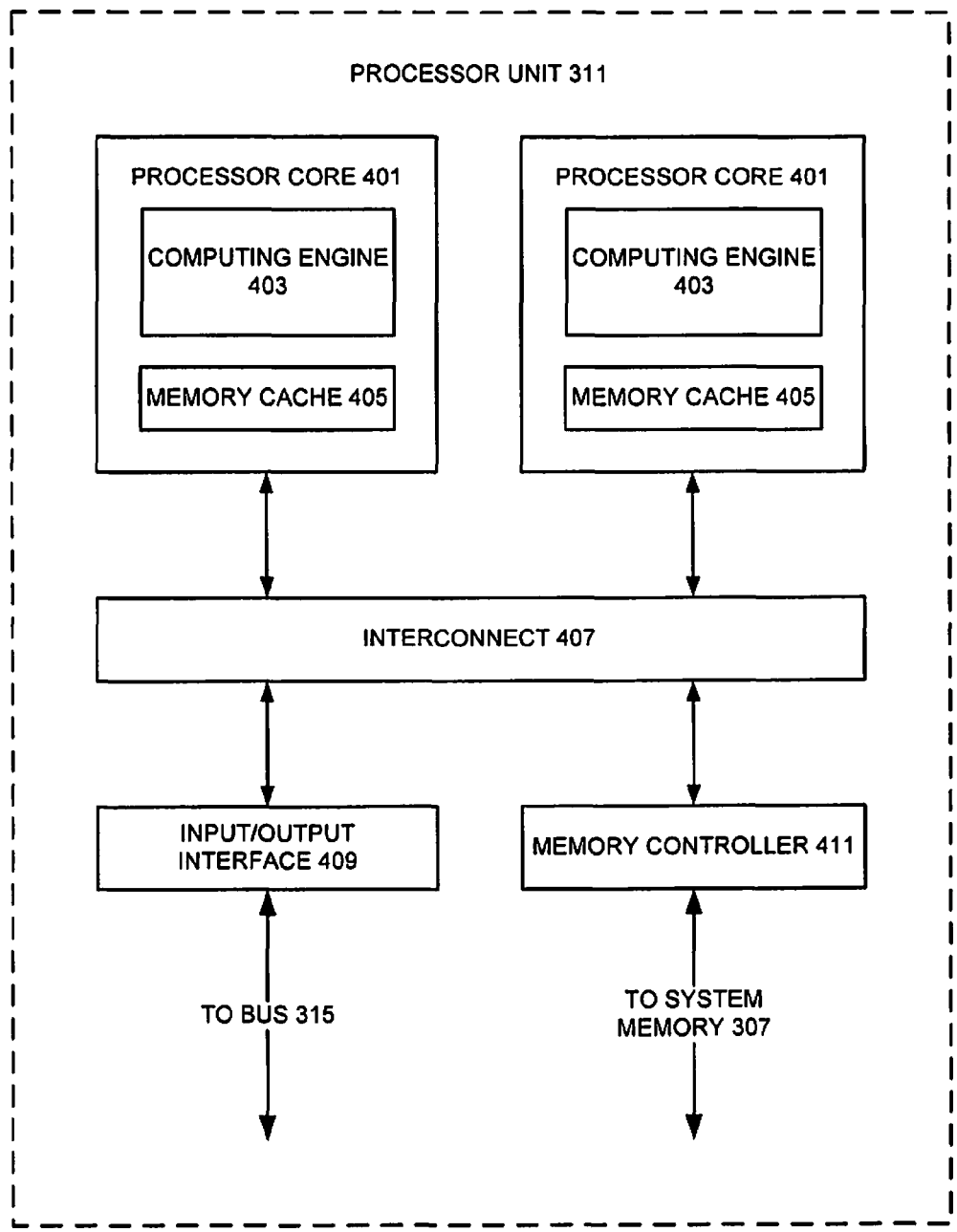
FIG. 4 illustrates a computer processing unit of the computer system illustrated in FIG. 3.

With some implementations of the invention, the master computing device 303 may employ one or more processing units 311 having more than one processor core. Accordingly, FIG. 4 illustrates an example of a multi-core processor unit 311 that may be employed with various embodiments of the invention. As seen in this figure, the processor unit 311 includes a plurality of processor cores 401. Each processor core 401 includes a computing engine 403 and a memory cache 405. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 403 may then use its corresponding memory cache 405 to quickly store and retrieve data and/or instructions for execution.

Each processor core 401 is connected to an interconnect 407. The particular construction of the interconnect 407 may vary depending upon the architecture of the processor unit 401. With some processor cores 401, such as the Cell microprocessor created by Sony Corporation, Toshiba Corporation and IBM Corporation, the interconnect 407 may be implemented as an interconnect bus. With other processor cores 401, however, such as the Opteron™ and Athlon™ dual-core processors available from Advanced Micro Devices of Sunnyvale, Calif., the interconnect 407 may be implemented as a system request interface device. In any case, the processor cores 401 communicate through the interconnect 407 with an input/output interfaces 409 and a memory controller 411. The input/output interface 409 provides a communication interface between the processor unit 411 and the bus 315. Similarly, the memory controller 411 controls the exchange of information between the processor unit 311 and the system memory 307. With some implementations of the invention, the processor units 311 may include additional components, such as a high-level cache memory accessible shared by the processor cores 401.

While FIG. 4 shows one illustration of a processor unit 311 that may be employed by some embodiments of the invention, it should be appreciated that this illustration is representative only, and is not intended to be limiting. For example, some embodiments of the invention may employ a master computer 303 with one or more Cell processors. The Cell processor employs multiple input/output interfaces 409 and multiple memory controllers 411. Also, the Cell processor has nine different processor cores 401 of different types. More particularly, it has six or more synergistic processor elements (SPEs) and a power processor element (PPE). Each synergistic processor element has a vector-type computing engine 403 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 311 can be used in lieu of multiple, separate processor units 311. For example, rather than employing six separate processor units 311, an alternate implementation of the invention may employ a single processor unit 311 having six cores, two multi-core processor units 311 each having three cores, a multi-core processor unit 311 with four cores together with two separate single-core processor units 311, or other desired configuration.

Returning now to FIG. 3, the interface device 313 allows the master computer 303 to communicate with the slave computers 317A, 317B, 317C . . . 317x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 313 translates data and control signals from the master computer 303 and each of the slave computers 317 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 317 may include a memory 319, a processor unit 321, an interface device 323, and, optionally, one more input/output devices 325 connected together by a system bus 327. As with the master computer 303, the optional input/output devices 325 for the slave computers 317 may include any conventional input or output devices, such as keyboards, pointing devices, microphones, display monitors, speakers, and printers. Similarly, the processor units 321 may be any type of conventional or custom-manufactured programmable processor device. For example, one or more of the processor units 321 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 321 may be custom manufactured processors, such as microprocessors designed to optimally perform specific types of mathematical operations. Still further, one or more of the processor units 321 may have more than one core, as described with reference to FIG. 3 above. For example, with some implementations of the invention, one or more of the processor units 321 may be a Cell processor. The memory 319 then may be implemented using any combination of the computer readable media discussed above. Like the interface device 313, the interface devices 323 allow the slave computers 317 to communicate with the master computer 303 over the communication interface.

In the illustrated example, the master computer 303 is a multi-processor unit computer with multiple processor units 311, while each slave computer 317 has a single processor unit 321. It should be noted, however, that alternate implementations of the invention may employ a master computer having single processor unit 311. Further, one or more of the slave computers 317 may have multiple processor units 321, depending upon their intended use, as previously discussed. Also, while only a single interface device 313 or 323 is illustrated for both the master computer 303 and the slave computers 317, it should be noted that, with alternate embodiments of the invention, either the master computer 303, one or more of the slave computers 317, or some combination of both may use two or more different interface devices 313 or 323 for communicating over multiple communication interfaces.

With various examples of the invention, the master computer 303 may be connected to one or more external data storage devices. These external data storage devices may be implemented using any combination of computer readable media that can be accessed by the master computer 303. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 317 may alternately or additions be connected to one or more external data storage devices.

Typically, these external data storage devices will include data storage devices that also are connected to the master computer 303, but they also may be different from any data storage devices accessible by the master computer 303.

It also should be appreciated that the description of the computer network illustrated in FIG. 3 and FIG. 4 is provided as an example only and is not intended to suggest any limitation as to the scope of use or functionality of alternate embodiments of the invention.

Freeform Sketch Routing

Figure 5:
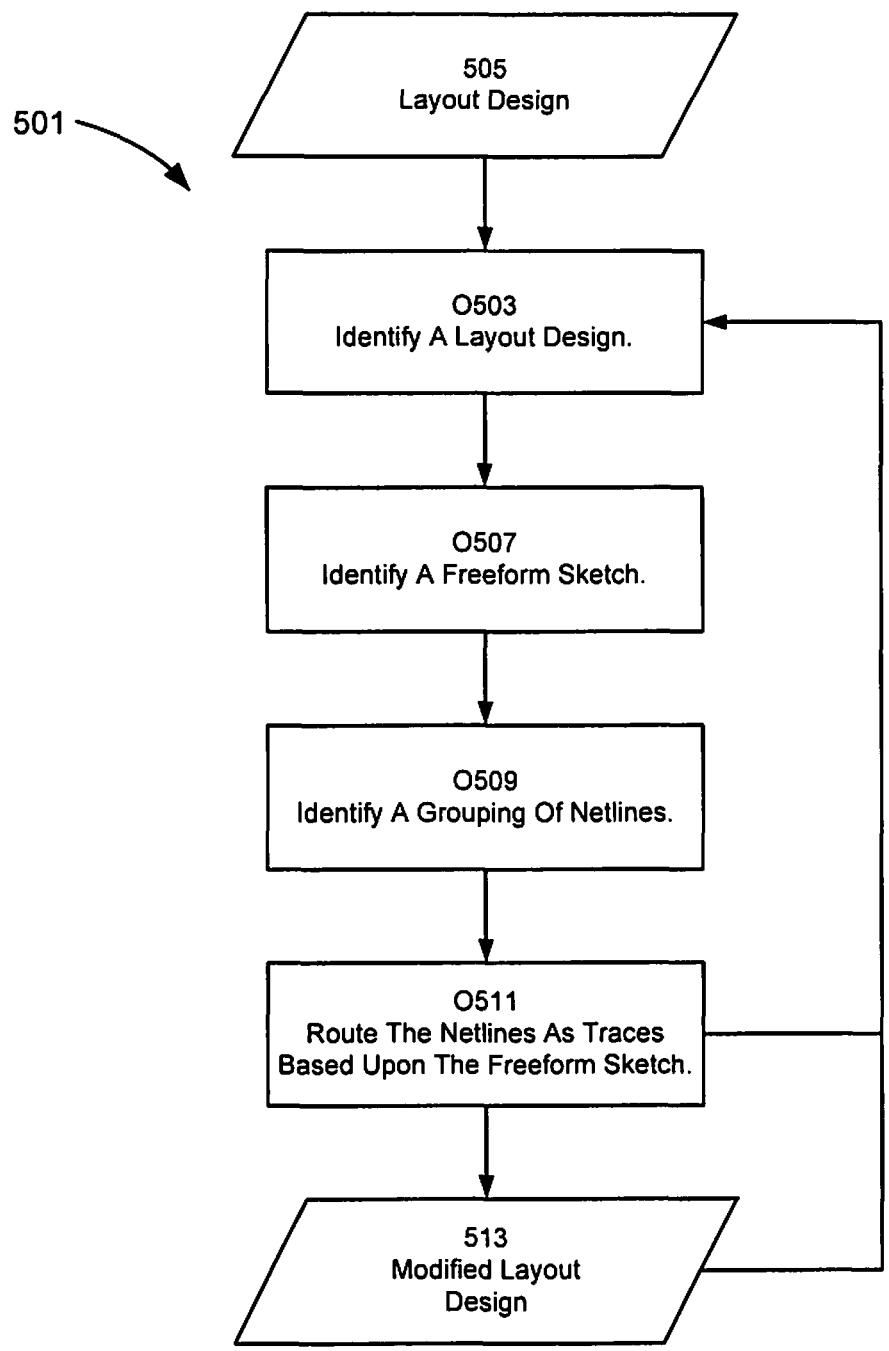
FIG. 5 illustrates a method of routing netlines as traces according to a freeform sketch.

As stated above, various implementations of the invention may be employed to route netlines as traces according to a freeform sketch. FIG. 5 illustrates a method 501 that may be provided according to various implementations of the invention. The method 501 includes an operation 503 for identifying a layout design 505. With various implementations of the invention, the layout design 505 is a layout design for a printed circuit board. With other implementations of the invention, the layout design 505 is a selected portion of a layout design for a printed circuit board. Still, with other implementations of the invention, the layout design 505 is a layout design for an integrated circuit, for example, a system-on-chip integrated circuit.

Figure 6:
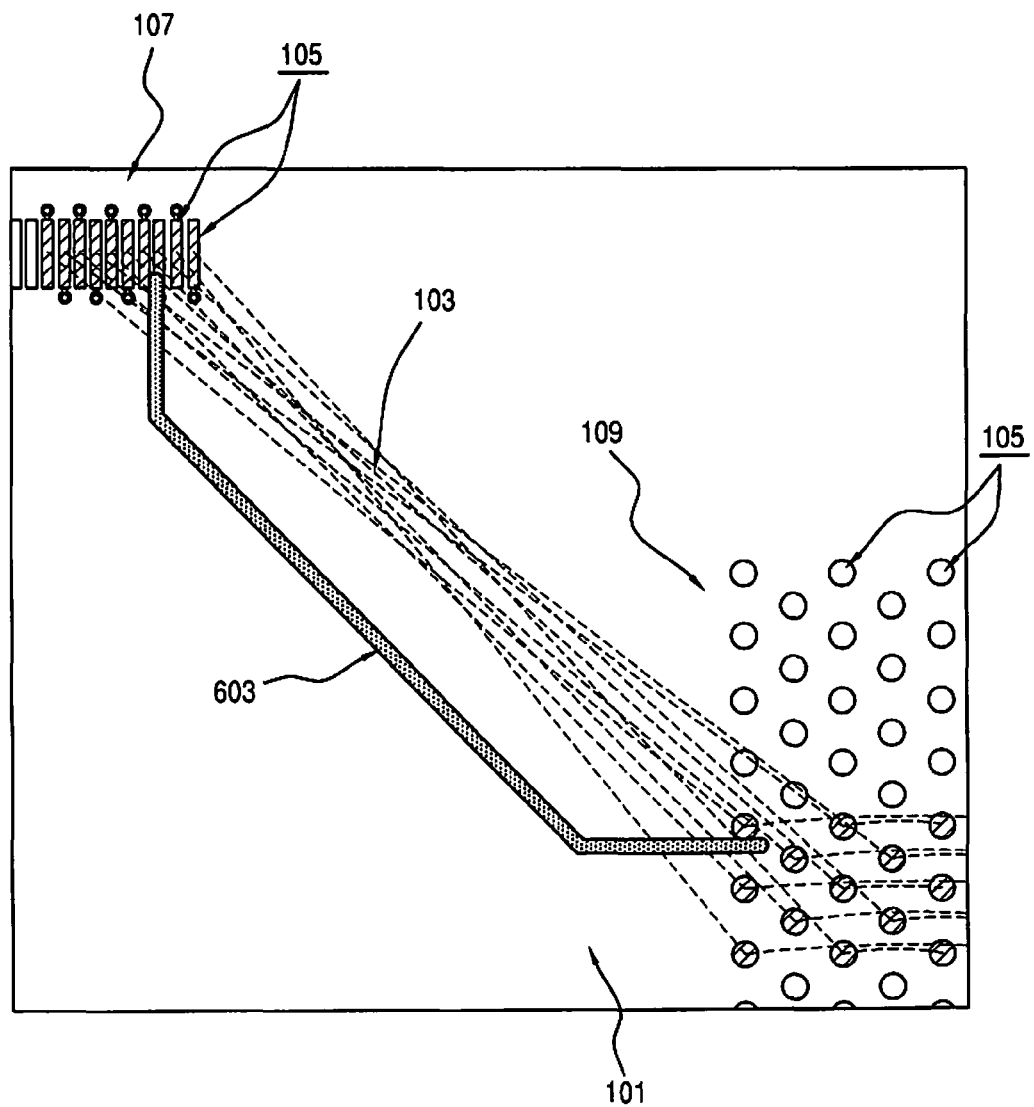
FIG. 6 illustrates a layout design.

The method 501 further includes an operation 507 for identifying a freeform sketch, an operation 509 for identifying a grouping of netlines, and an operation 511 for routing the grouping of netlines as traces wherein a modified layout design 513 is formed. In various implementations of the present invention, the freeform sketch may be a line. For example, FIG. 6 illustrates the layout design 101 of FIG. 1 and a freeform sketch 603. As can be seen from FIG. 6, the freeform sketch 603 is a line. Alternatively, the freeform sketch may be a trace, such as for example a trace already routed in the layout design. With various other implementations of the present invention, the freeform sketch is a free-form line specified by the user. Still, in further implementations, the freeform sketch is a free-form line drawn by the user.

First Illustrative Example of Traces Routed According to a Freeform Sketch

Figure 7:
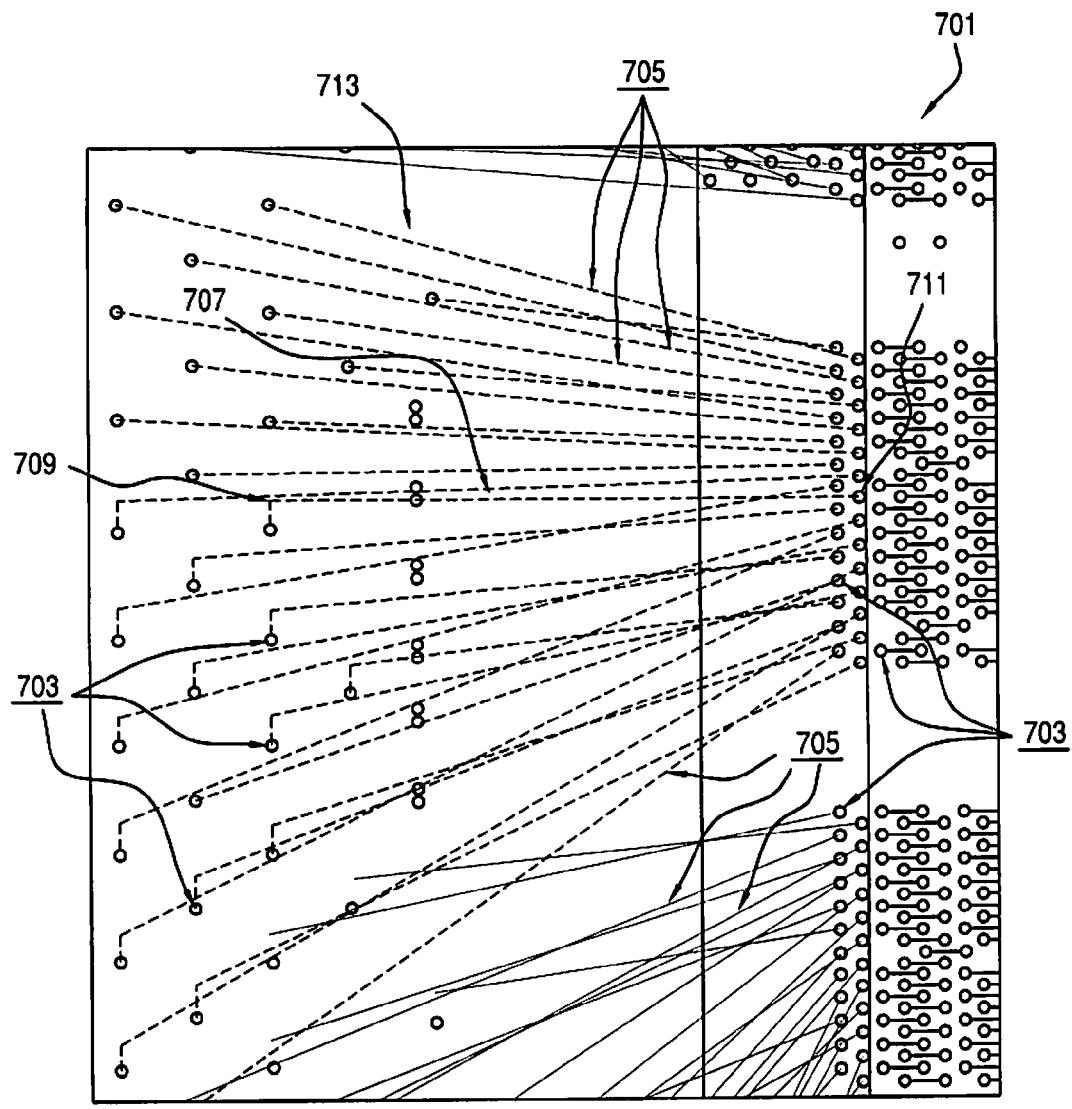
FIG. 7 illustrates layout design.

FIG. 7 illustrates a layout design 701. As can be seen from this figure, the layout design 701 includes pins 703 and netlines 705. A grouping of the netlines 703 may be routed as traces by various implementations of the present invention, such as for example the method 501 of FIG. 5. As stated above, the method 501 includes the operation 503 for identifying a layout design 505. Accordingly, the layout design 701 may be identified by the operation 503. The method 501 further includes the operation 507 for identifying a freeform sketch. As stated, various implementations of the invention provide that a netline may be identified as the freeform sketch. Accordingly, a netline, such as the netline 707 shown in FIG. 7 may be identified as the freeform sketch. Further still, a grouping of netlines is identified by the operation 509. In various implementations of the invention, a user may manually select a grouping of netlines, which would then be subsequently identified by the operation 509. With various implementations of the invention, the operation 509 identifies a grouping of netlines in an automated manner.

Figure 8:
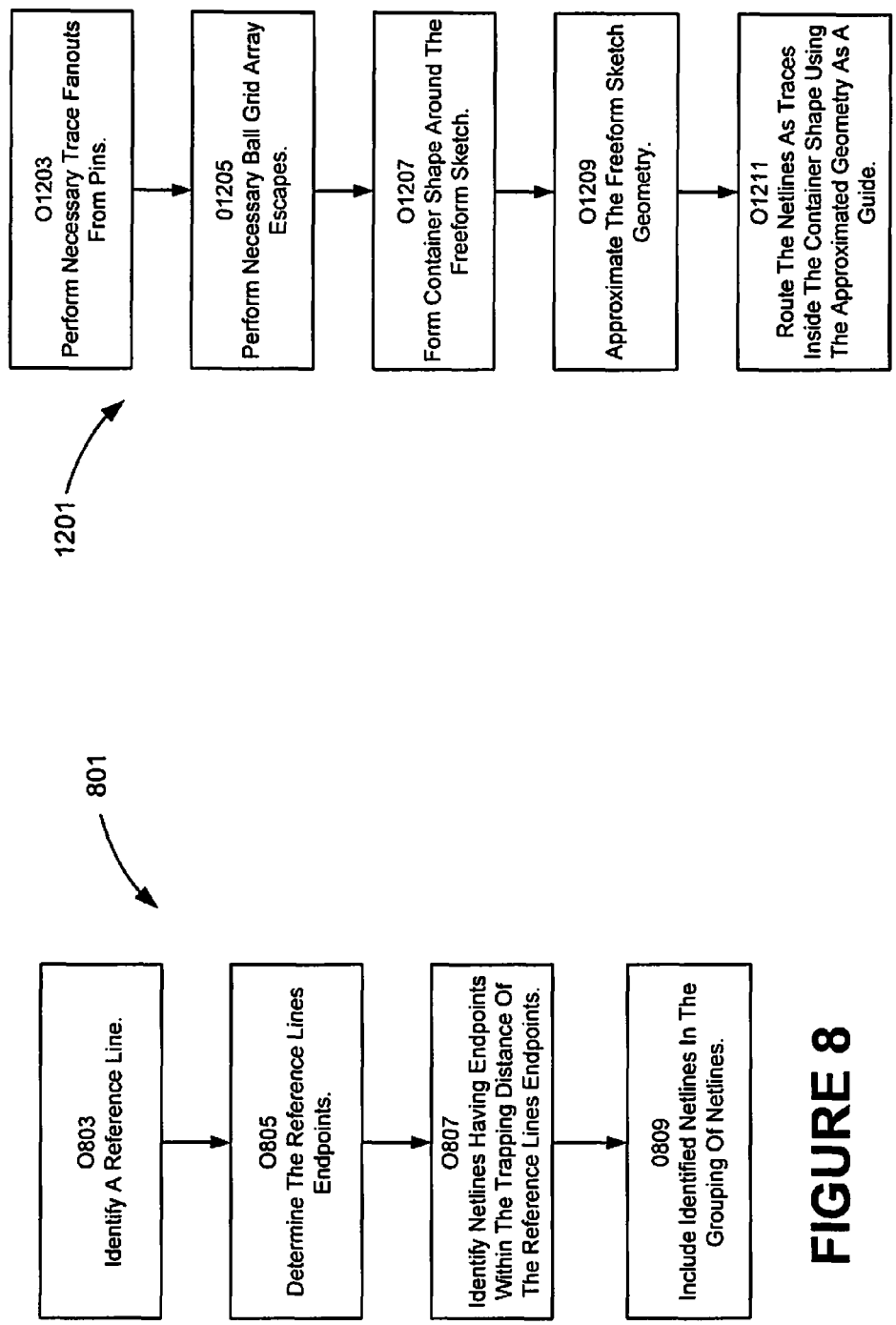
FIG. 8 illustrates a method of identifying a grouping of netlines for routing as traces.

FIG. 8 illustrates a method 801 that may be implanted to identify a grouping of netlines. Various implementations provide that the method 801 is performed by the operation 509. As can be seen from FIG. 8, the method 801 includes an operation 803 for identifying a reference line. With various implementations, the reference line is the freeform sketch.

The method 801 additionally includes an operation 805 for identifying endpoints of the reference line, an operation 807 for identifying netlines having endpoints within a trapping distance from the endpoints of the reference line, and an operation 809 for including the identified netlines in the grouping of netlines.

For example, the operation 803 may identify the netline 707 of FIG. 7 as the reference line. Accordingly, the operation 805 would identify the endpoint 709 and the endpoint 711 as the endpoints of the reference line. Furthermore, the operation 807 would identify the netlines 703 whose endpoints were within the trapping distance from the endpoint 709 or the endpoint 711. In various implementations of the present invention, the trapping distance is specified by a user. With various implementations of the invention, the trapping distance may be 25 millimeters. Further still, in various implementations of the invention, the trapping distance may be 100 millimeters. As illustrated in FIG. 8, the identified netlines are included in the grouping of netlines to be routed as traces. More particularly, FIG. 7 illustrates a grouping of netlines 713, which may be generated by various implementations of the invention.

Figure 9:
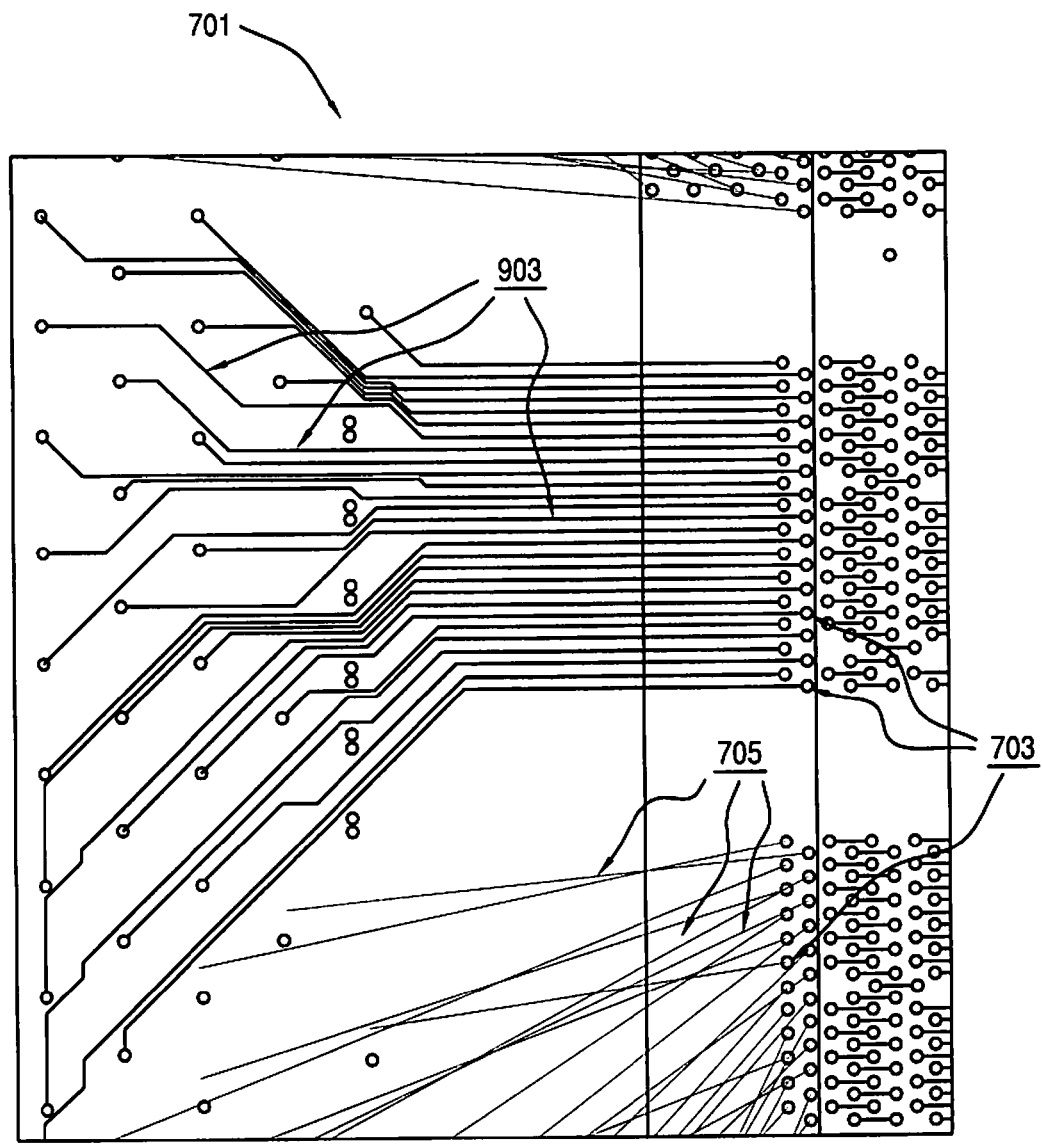
FIG. 9 illustrates the layout design of FIG. 7, shown in further detail.

Returning to FIG. 5, the method 501 further includes the operation 511 for routing the grouping of netlines 713 as traces based upon the freeform sketch 707. FIG. 9 illustrates the layout design 701 of FIG. 7, including netlines 703, pins 705. Additionally, FIG. 9 illustrates traces 903 routed in place of the grouping of netlines 713. With various implementations of the invention, the operation 511 invokes an automated trace routing engine to cause the grouping of netlines 713 to be routed as traces 903 based upon the freeform sketch. Those of skill in the art can appreciate that various automated trace routing tools exists, such as for example the Alegro toolset available from Cadence Design Systems of San Jose, Calif., or the Board Designer toolset available from Altruin or the PADS toolset available from Mentor Graphics Corporation of Wilsonville, Oreg. Various further implementations of the invention may provide that the modified layout shown in FIG. 9 be saved to a memory storage location.

Second Illustrative Example of Traces Routed According to a Freeform Sketch

Figure 10:
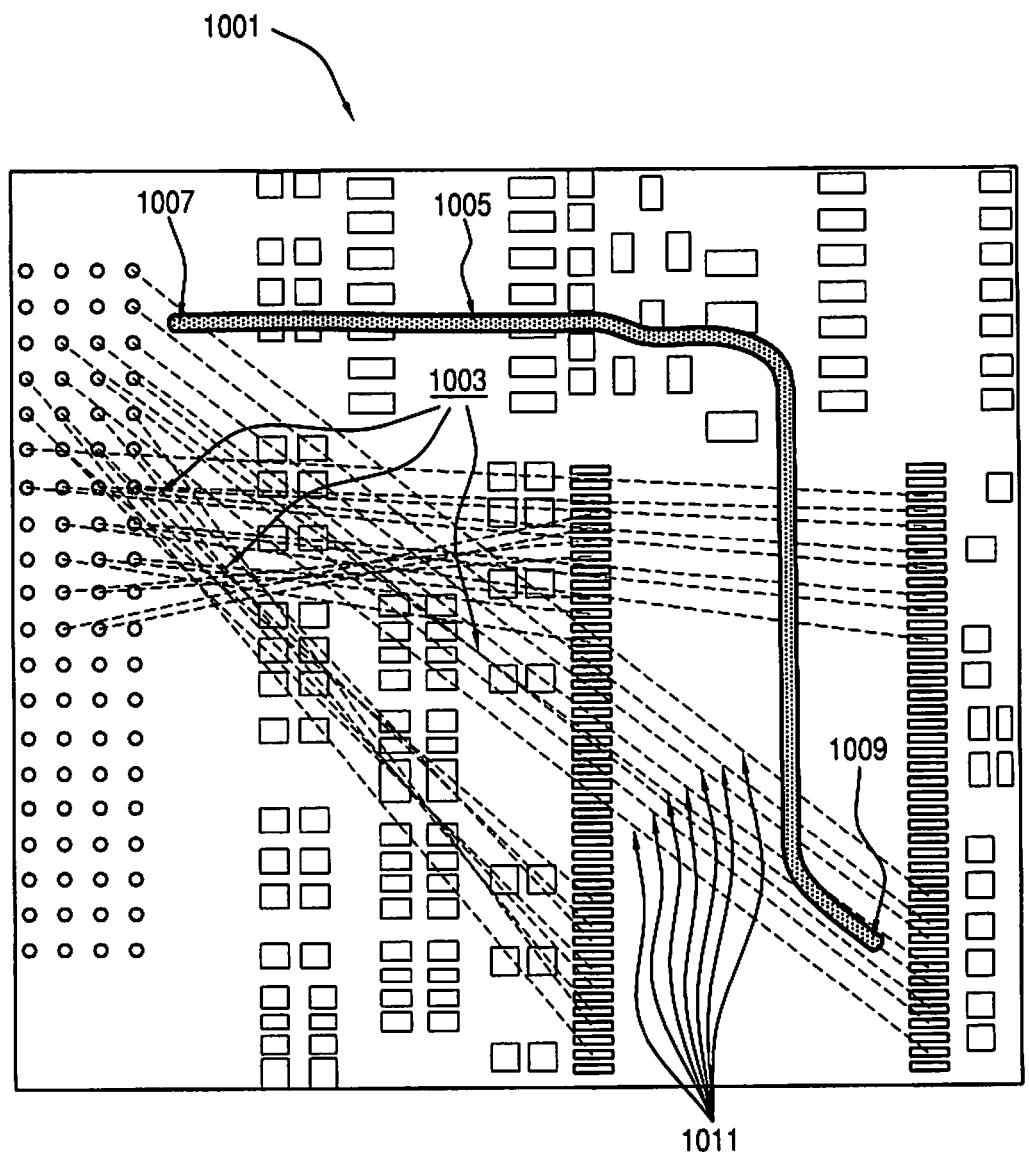
FIG. 10 illustrates a layout design.

FIG. 10 illustrates a layout design 1001. As can be seen from this figure, the layout design 1001 includes netlines 1003 and a free-form line 1005. A grouping of the netlines 1003 may be routed as traces by various implementations of the invention, such as for example the method 501 of FIG. 5. Accordingly, the layout design 1001 may be identified by the operation 503. As stated above, with various implementations, the operation 507 identifies a free-form line, such as the free-form line 1005, as the freeform sketch. With further implementations of the invention, the free-form line 1005 is drawn by a user.

As further stated above, the operation 509 may perform the method 801 of FIG. 8. Accordingly, the operation 803 for identifying a reference line may identify the free-form line 1005 as the reference line. Furthermore, an endpoint 1007 and an endpoint 1009 may be identified by the operation 805 as the endpoints of the reference line. Subsequently, the netlines 1003 having endpoints within a trapping distance from the endpoints 1007 and 1009 may be identified by the operation 807 and included in the grouping of netlines by the operation 809. In various implementations of the present invention, the operation 807 identifies only those netlines where both endpoints are within the trapping distance of the endpoints 1007 and 1009. With various implementations of the present invention, the operation 807 identifies those netlines where a single endpoint is within the trapping distance from either of the endpoints 1007 or 1009. Sill, with various implementations of the present invention, the operation 807 identifies those netlines where either both endpoints are within the trapping distance of the endpoints 1007 and 1009 or where a single endpoint is within the trapping distance from either of the endpoints 1007 or 1009.

Figure 11:
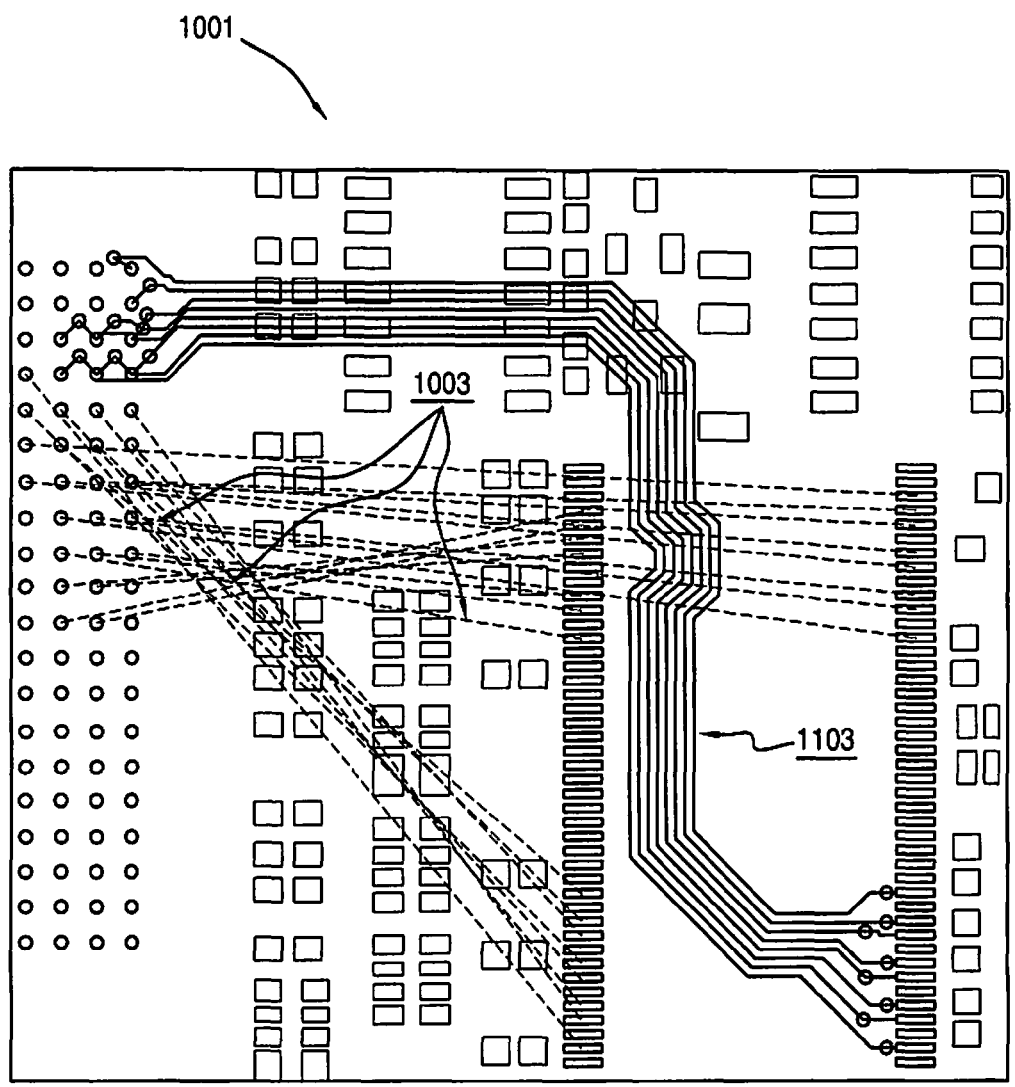
FIG. 11 illustrates the layout design of FIG. 10, shown in further detail.

For example, a grouping of netlines 1011 may be formed by the method 801 of FIG. 8. Subsequently, the grouping of netlines 1011 may be routed as traces by the operation 511 shown in FIG. 5. In various implementations of the present invention, the operation 511 routes the netlines as traces by approximating the geometry of the freeform sketch. Accordingly, the grouping of netlines 1011 may be routed as traces 1103 as illustrated in FIG. 11. As can be seen from this figure, the layout design 1001 is shown, along with the netlines 1003 and the traces 1103. In various implementations of the present invention, the geometry of the freeform sketch is approximated by application of a local layer bias determination technique, such as for example the technique for routing traces based upon a local layer bias as described in U.S. patent application Ser. No. 12/363,211, entitled "Heuristic Routing For Electronic Device Layout Designs", filed Jan. 30, 2009, which application is incorporated entirely herein by reference).

In various implementations of the invention, the operation 511 for routing the grouping of netlines as traces may be facilitated by performing the method 1201 show in FIG. 12. As can be seen from this figure, the method 1201 includes an operation 1203 for fanning out or fanning in necessary pins. With various implementations of the present invention, the pins may be fanned out to the layer the sketch resides on. Still, with further implementations, the pins may be fanned out to an active routing layer. Various techniques exist for performing fanouts, such as for example the technique described in U.S. patent application Ser. No. 11/983,797, entitled "Alternating Via Fanout Patterns," filed Nov. 8, 2007, which application is incorporated entirely herein by reference.

The method 1201 further includes an operation 1205 for performing any necessary ball grid array escapes. In various implementations of the invention, a ball grid array escape engine is invoked by the operation 1205 to perform the necessary ball grid array escapes. Those of skill in the art appreciate that ball grid array escapes may be accomplished in a variety of ways. For example, U.S. patent application Ser. No. 11/937,411, entitled "Use Of Breakouts In Printed Circuit Board Designs," filed Nov. 8, 2007, which application is incorporated entirely herein by reference.

Figure 13:
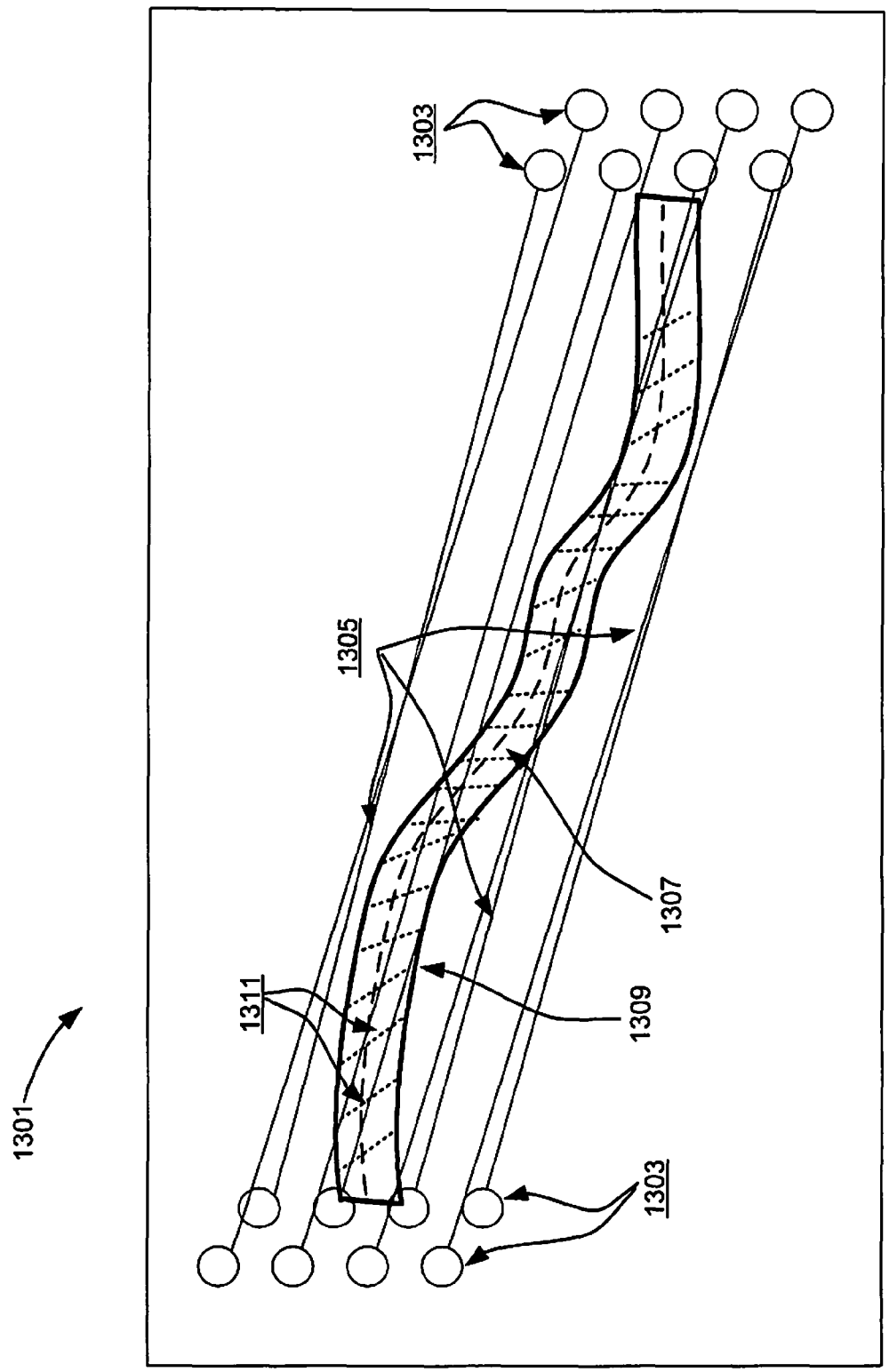
FIG. 13 illustrates layout design.

Still further, the method 1201 includes an operation 1207 for forming a container shape around the freeform sketch. For example, FIG. 13 illustrates a layout design 1301 containing pins 1303, netlines 1305, a freeform sketch 1307, and a container shape 1309. Various implementations of the present invention provide for a container of a fixed size to be formed. With further implementations of the invention, the size of the formed container may depend upon the number of netlines in the grouping of netlines. Still, in various implementations of the present invention, the size of the container may be 10 millimeters wide.

Figure 14:
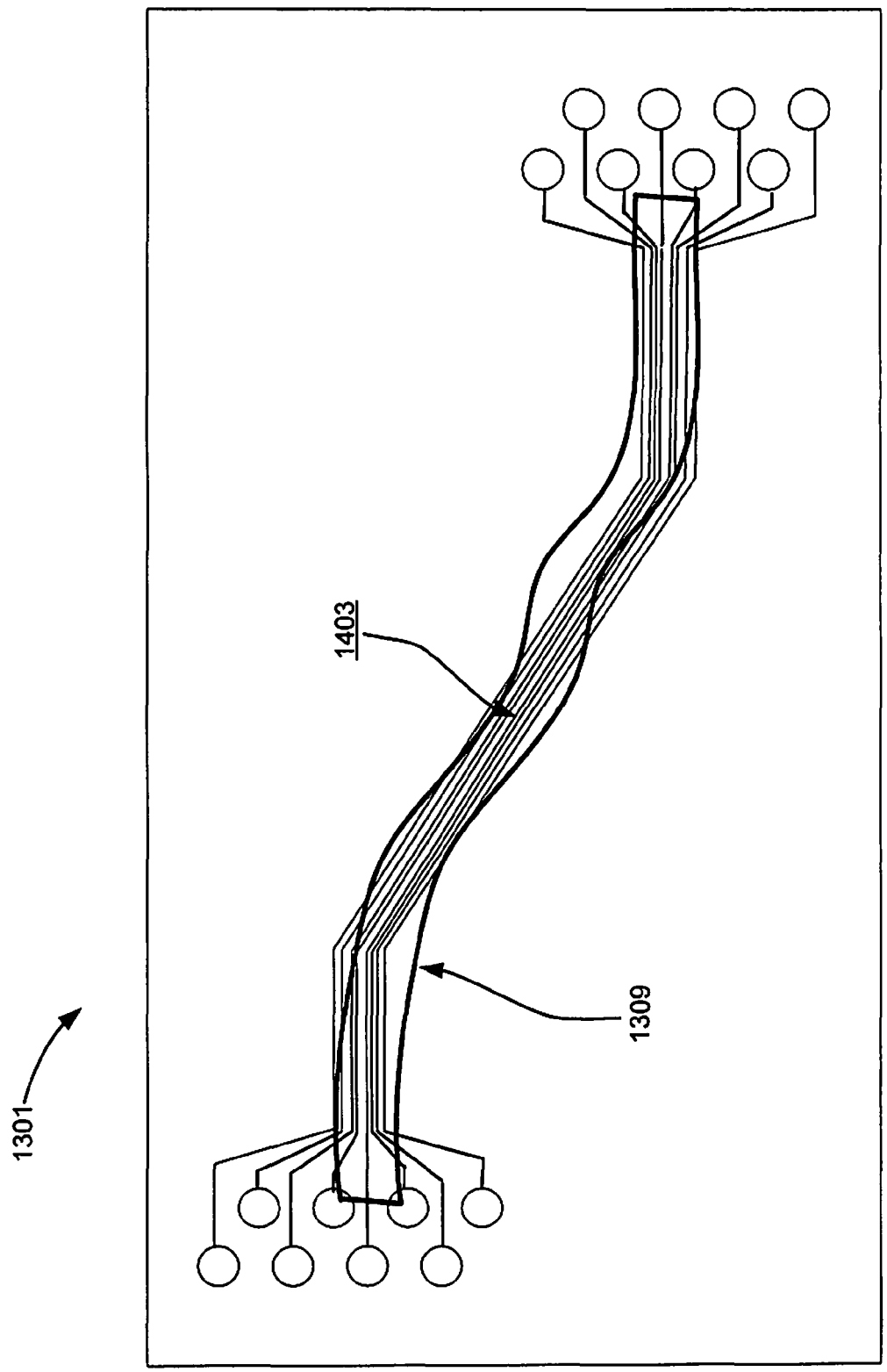
FIG. 14 illustrates the layout design of FIG. 13, shown in greater detail.

Returning again to FIG. 12, the method 1201 additionally includes an operation 1209 for approximating the geometry of the freeform shape. In various implementations of the invention, the operation 1209 inserts lines 1311, which intersect the freeform shape 1307 at selected angles and intervals, into the container shape 1309, as illustrated in FIG. 13. In various implementations, the lines 1311 intersect the freeform sketch at a 45 degree angle. The method 1201 further includes the operation 1211 for routing the netlines as traces in the container. In various implementations, the traces are routed by using the lines 1311 as guides. For example, FIG. 14 illustrates the layout design 1301 of FIG. 13, the container shape 1309 and traces 1403 routed in the container shape by using the lines 1311 as guides.

Figure 16:
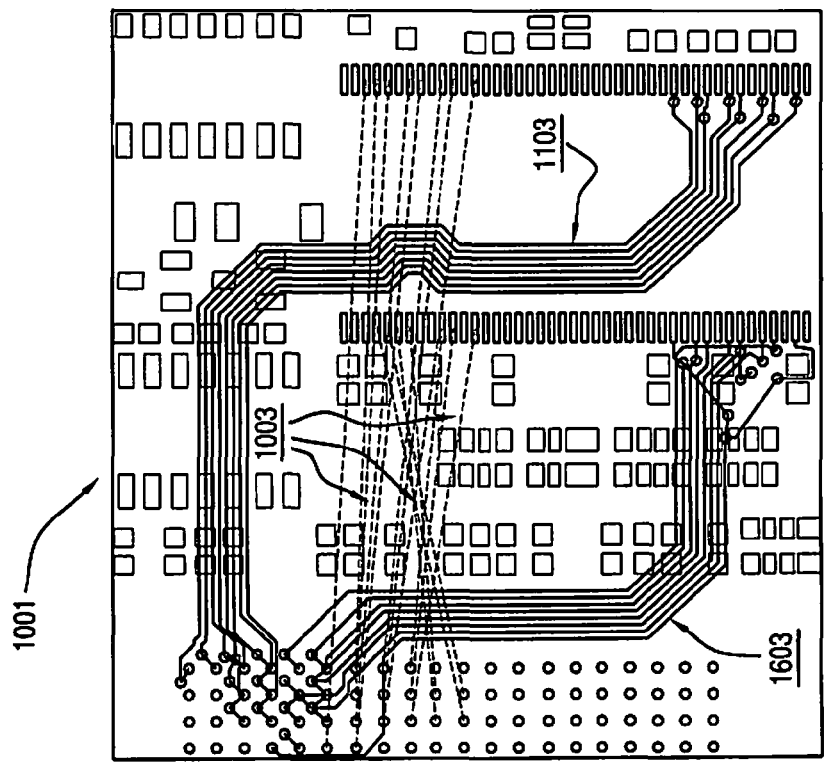
FIG. 16 illustrates the layout design of FIG. 15, shown in greater detail.
Figure 15:
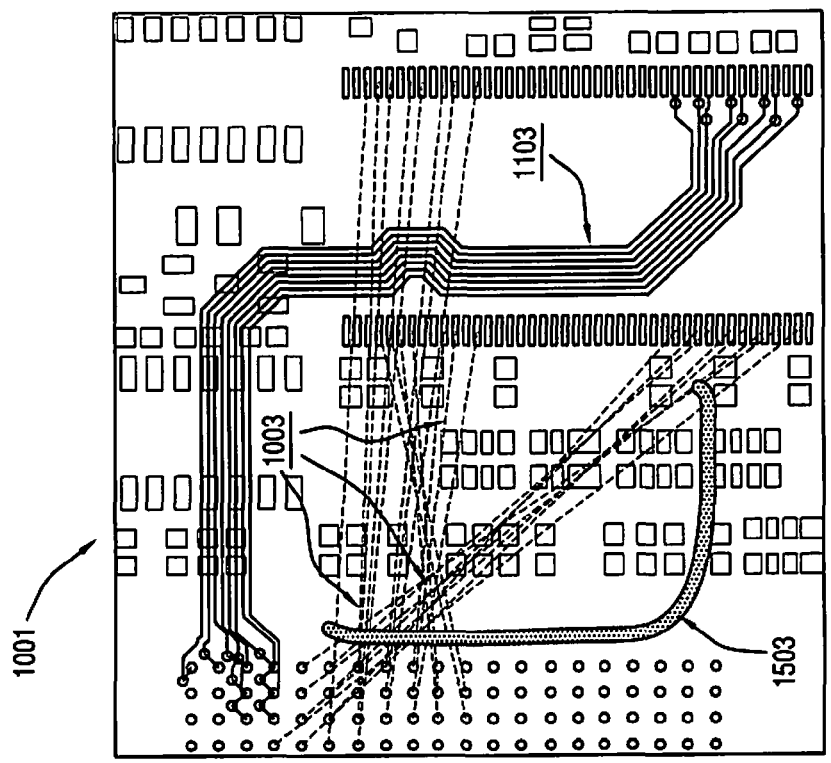
FIG. 15 illustrates the layout design of FIG. 11, shown in greater detail.
Figure 18:
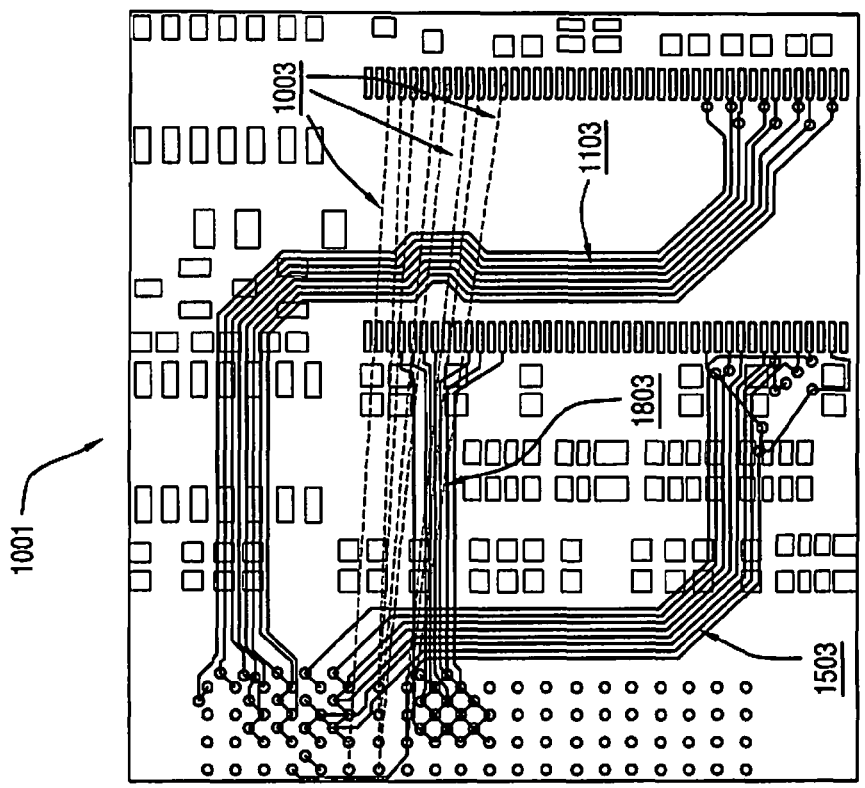
FIG. 18 illustrates the layout design of FIG. 17, shown in greater detail.
Figure 17:
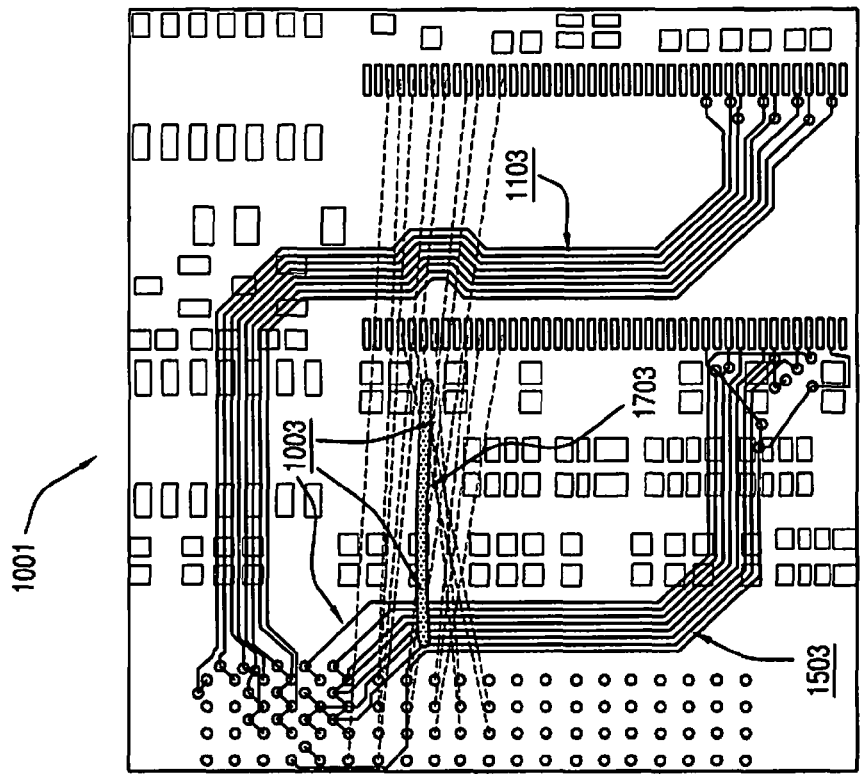
FIG. 17 illustrates the layout design of FIG. 16, shown in greater detail.

In further implementations of the present invention, portions of the method 501 may be repeated to route ones of the remaining netlines 1103. For example, FIG. 15 illustrates the layout design 1001 of FIG. 11, further including a free-form line 1503. As detailed above, the method 501 may be employed to route the netlines 1003 as traces according to the free-form line 1503. FIG. 16 illustrates the layout design 1001 of FIG. 15, wherein traces 1603 have been routed in place of a grouping of the netlines 1003 according to the geometry of the freeform line 1503. Additionally, FIGS. 17 and 18 illustrates the layout design 1001 of FIG. 16, further including a free-form line 1703 and traces 1803 routed according to various implementations of the present invention. Those of skill in the art can appreciate the traces 1103 and 1603 may be routed on the same layer of the layout design 1001 as illustrated in FIG. 16, while the traces 1803 may be routed on a different layer of the layout design 1001. Additionally, the traces 1103, 1603, and 1803 may all be routed on different layers or the same layer of a layout design.

Freeform Sketch Routing Apparatus

Figure 19:
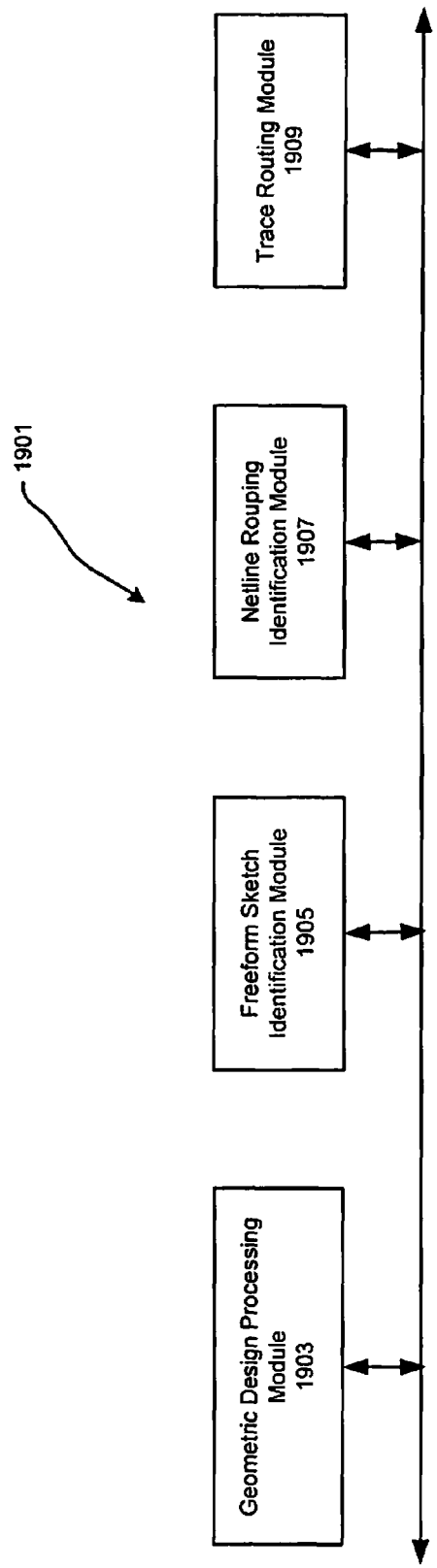
FIG. 19 illustrates an apparatus for routing netlines as traces according to a freeform sketch.

FIG. 19 illustrates an apparatus 1901 for routing netlines as traces in a layout design according to a freeform sketch. As can be seen form this figure, the apparatus 1901 includes a module 1903 for processing a geometric design, such as a layout design for a printed circuit board. The apparatus 1901 further includes a module 1905 for identifying a freeform sketch, a module 1907 for identifying a grouping of netlines, and a module 1909 for routing netlines as traces. In various implementations of the invention, the module 1903-1909 are program executable on a programmable computer. Accordingly, the modules 1903-1909 are capable of accessing, altering, saving, generating, and displaying data representing physical layout designs, for example a layout design for a printed circuit board.

CONCLUSION

Various implementations of the invention provide methods and apparatuses for routing traces in a layout design. In various implementations of the invention, a group of netlines within a layout design for a printed circuit board and a freeform sketch are identified. Subsequently, the netlines are routed as traces according to the freeform sketch. More particularly, the geometry of the traces is determined by approximating the geometry of the freeform sketch. Various implementations of the invention provide for the netlines to be routed by an automated trace routing engine. With further implementations of the invention, ball grid array escapes and trace fanouts are additionally routed. For example, ball grid array escapes may be routed prior to netlines being routed according to the freeform sketch. In further implementations of the invention, the freeform sketch is deleted after the traces have been routed.

With various implementations of the invention, the netlines are routed as traces by forming a container shape around the freeform sketch, approximating the geometry of the freeform sketch within the container shape, and routing traces within the container shape using the approximation of the freeform shape as a guide.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method comprising:
receiving, by a computing system, user input in a form of a freeform sketch correlated to a location in a design layout; and
forming, by the computing system, one or more traces in the design layout corresponding to one or more netlines in the design layout based, at least in part, on a shape of the freeform sketch as correlated to the location in the design layout, wherein an electronic device is capable of being manufactured based, at least in part, on the design layout.

2. The method recited in claim 1, wherein forming the traces in the design layout further comprises:
determining an approximate geometry of the freeform sketch; and
forming the one or more traces according to the approximated geometry.

3. The method recited in claim 2, wherein determining the approximate geometry of the freeform sketch further comprises:
generating a container shape, the boundaries of the container shape comprising the freeform sketch; and
inserting lines into the container shape, the lines overlaying the freeform sketch at a selected angle.

4. The method recited in claim 3, wherein the selected angle is 45 degrees.

5. The method recited in claim 3, wherein forming the one or more traces according to the approximated geometry further comprises using the lines as guides to route the traces in the design layout.

6. The method recited in claim 5, further comprising routing at least one of ball grid array escapes or fanouts.

7. The method recited in claim 5, further comprising deleting the freeform sketch from the design layout.

8. The method recited in claim 2, wherein forming the one or more traces according to the approximated geometry further comprises:
determining a local layer bias based upon the approximated geometry;
forming a layer bias map based upon the approximated layer bias; and
routing one or more of the netlines as traces based in part upon the layer bias map.

9. An apparatus comprising at least one computer-readable memory device storing instructions configured to cause one or more processing devices to perform operations comprising:
selecting one or more netlines to route in a design layout based, at least in part, on a configuration of a freeform sketch correlated to a location in the design layout; and
forming one or more traces in the design layout corresponding to the selected netlines, wherein an electronic device is capable of being manufactured based, at least in part, on the design layout.

10. The apparatus recited in claim 9, wherein forming the one or more traces in the design layout further comprises:
determining an approximate geometry of the freeform sketch; and
forming the one or more traces according to the approximated geometry.

11. The apparatus recited in claim 10, wherein determining the approximate geometry of the freeform sketch further comprises:
generating a container shape, the boundaries of the container shape comprising the freeform sketch; and
inserting lines into the container shape, the lines overlaying the freeform sketch at a selected angle.

12. The apparatus recited in claim 11, wherein the selected angle being 45 degrees.

13. The apparatus recited in claim 11, wherein forming the one or more traces according to the approximated geometry comprising using the lines as guides to route the traces in the design layout.

14. The apparatus recited in claim 13, wherein the instructions are configured to cause the one or more processing devices to perform operations further comprising routing at least one of ball grid array escapes or fanouts.

15. The apparatus recited in claim 13, wherein the instructions are configured to cause the one or more processing devices to perform operations further comprising deleting the freeform sketch.

16. A system comprising:
a processor system; and
a memory system including software instructions, wherein the processor system, in response to execution of the software instructions, is configured to identify user input received by the processor system in a form of a freeform sketch to a portion of a design layout, and form one or more traces in the design layout corresponding to one or more netlines in the design layout based, at least in part, on a configuration of the freeform sketch as correlated to the location in the design layout, wherein an electronic device is capable of being manufactured based, at least in part, on the design layout.

17. The system recited in claim 16, wherein the processor system, in response to execution of the software instructions, is further configured to determine an approximate geometry of the freeform sketch, and form the one or more traces according to the approximated geometry.

18. The system recited in claim 17, wherein the processor system, in response to execution of the software instructions, is further configured to generate a container shape, the boundaries of the container shape comprising the freeform sketch, and to insert lines into the container shape, the lines overlaying the freeform sketch at a selected angle.

19. The system recited in claim 18, wherein the processor system, in response to execution of the software instructions, is further configured to utilize the lines as guides to route the traces in the design layout in forming the one or more traces according to the approximated geometry.

20. The system recited in claim 16, wherein the processor system, in response to execution of the software instructions, is further configured to delete the freeform sketch.

* * * * *